United States Patent
Barkau

(10) Patent No.: US 9,790,730 B2
(45) Date of Patent: Oct. 17, 2017

(54) CONTAINER FOR ACTUATING A DRIVE DEVICE OF THE CONTAINER

(71) Applicant: Kessebohmer Holding e.K., Bad Essen (DE)

(72) Inventor: Rene Barkau, Ostercappeln (DE)

(73) Assignee: Kessebohmer Holding e.K., Bad Essen (DE)

( * ) Notice: Subject to any disclaimer, the term of this patent is extended or adjusted under 35 U.S.C. 154(b) by 0 days.

(21) Appl. No.: 14/890,326

(22) PCT Filed: May 9, 2014

(86) PCT No.: PCT/EP2014/059535
§ 371 (c)(1),
(2) Date: Nov. 10, 2015

(87) PCT Pub. No.: WO2014/184103
PCT Pub. Date: Nov. 20, 2014

(65) Prior Publication Data
US 2016/0123066 A1    May 5, 2016

(30) Foreign Application Priority Data
May 11, 2013 (DE) .................. 10 2013 104 866

(51) Int. Cl.
*E05F 15/73* (2015.01)
*B65D 43/26* (2006.01)
(Continued)

(52) U.S. Cl.
CPC .............. *E05F 15/73* (2015.01); *B65D 43/26* (2013.01); *E05F 15/611* (2015.01);
(Continued)

(58) Field of Classification Search
CPC .................. E05F 15/73; B65D 43/26
(Continued)

(56) References Cited

U.S. PATENT DOCUMENTS 3,940,016 A * 2/1976 Krakauer ............... G07F 11/42
221/129
4,072,846 A * 2/1978 Christen ............... G01N 30/30
165/287

(Continued)

FOREIGN PATENT DOCUMENTS

| AT | 413935 B | 7/2006 |
| DE | 202005006945 U1 | 5/2006 |

(Continued)

OTHER PUBLICATIONS

Chinese Office Action, Chinese Application No. 201480026800.9, dated May 9, 2014.

*Primary Examiner* — Bentsu Ro
(74) *Attorney, Agent, or Firm* — Dinsmore & Shohl LLP

(57) ABSTRACT

Container comprising
a first element 2 and at least a second element 3 movable relative to the first element 2 between a closed position and an open position, and a drive device 5 for moving the second element 3,
wherein at least one deformation measuring unit 6 is provided with a deformation sensor 11 on at least one of the elements 2, 3 for detecting a force exerted on one of the elements 2, 3 and
wherein a control unit 12 is provided for receiving and evaluating a deformation signal transmitted by the deformation measuring unit 6 and is provided for actuating the drive device 5.

12 Claims, 5 Drawing Sheets

(51) Int. Cl.
  *H03K 17/96* (2006.01)
  *E05F 15/611* (2015.01)
  *H03K 17/965* (2006.01)
  *E05D 15/46* (2006.01)
  *A47B 88/457* (2017.01)

(52) U.S. Cl.
  CPC ......... *H03K 17/964* (2013.01); *H03K 17/965* (2013.01); *A47B 88/457* (2017.01); *E05D 15/46* (2013.01); *E05Y 2400/852* (2013.01); *E05Y 2400/86* (2013.01); *E05Y 2900/20* (2013.01); *H03K 2217/9651* (2013.01)

(58) Field of Classification Search
  USPC ....... 318/264–266, 272, 275, 277, 282, 286, 318/466–469, 475, 626
  See application file for complete search history.

(56) References Cited

U.S. PATENT DOCUMENTS

| | | | | |
|---|---|---|---|---|
| 4,408,146 | A | * | 10/1983 | Beckerman ............. E05F 15/41 318/264 |
| 4,625,291 | A | * | 11/1986 | Hormann ............. E05F 15/668 318/265 |
| 7,500,400 | B1 | | 3/2009 | Huber |
| 7,868,578 | B2 | | 1/2011 | Scheffknecht et al. |
| 2008/0115417 | A1 | | 5/2008 | Huber |

FOREIGN PATENT DOCUMENTS

| | | |
|---|---|---|
| DE | 202007011769 U1 | 2/2008 |
| DE | 202011005155 U1 | 7/2012 |
| EP | 2248981 A1 | 11/2010 |
| WO | 2008/141348 | 11/2008 |

\* cited by examiner

CONTAINER FOR ACTUATING A DRIVE DEVICE OF THE CONTAINER

CROSS-REFERENCE TO RELATED APPLICATIONS

This application is the U.S. national stage of PCT/EP2014/059535 filed May 9, 2014, which claims priority of German Patent Application 10 2013 104 866.8 filed May 11, 2013.

FIELD OF THE INVENTION

The invention relates to a container having a first element and at least a second element movable relative to the first element between a closed position and an open position, as well as a drive device for moving the second element. The container can be a piece of furniture, a household appliance, as for example a kitchen appliance or built-in kitchen appliance, or a vending machine.

BACKGROUND OF THE INVENTION

A piece of furniture of the above named type is known from WO 2008/141348 A2. The piece of furniture has a first element in form of a furniture shell and a second element in form of a movable flap. By means of the drive device, the flap can be automatically transferred into an open or a closed position. For actuating, i.e. switching-on the drive device, a switching element is provided. The switching element is arranged and formed such, that by a movement of the flap caused by a user, the drive device is actuated. In this case, the flap is arranged in its closed position such, that it covers the switching element and abuts the same. Because of a pressure loading onto the flap in direction towards the piece of furniture a pressure switch of the switching element is switched and the drive device is actuated. In this case, a sufficient large compression path has to be provided for the pressure switch and thus for the flap, which compression path has to be provided between the flap and the piece of furniture. This can, for example, be ensured by a spring buffer. It can be disadvantageous, that with each pressure application onto the flap the drive device is actuated and the flap is transferred into the open position, even when the flap was pushed accidentally. WO 2008/141348 A2 proposes alternatively to provide a position measuring device, by means of which also the velocity and acceleration of the movement of the flap can be calculated. This allows, that driving of the flap by means of the drive device is carried out in dependency of the determined sizes of the flap. In this case, also a corresponding pushing path has to be provided via spring buffers. A further alternative, which is proposed in WO 2008/141348 A2, are capacitive switching elements, which operate free of contact.

SUMMARY OF THE INVENTION

The object of the present invention is to provide a container of the above named type, in which it is possible to realise that for actuating the drive device, an as small as possible path, which preferably is not noticeable for the user, can be achieved for actuating an actuating device.

The object is met according to the invention by a container, which comprises a first element and at least one second element movable relative to the first element between a closed position and an open position as well as a drive device for moving the second element, wherein at least one deformation measuring unit is provided with a deformation sensor on one of the elements for detecting a force exerted on one of the elements, and wherein a control unit is provided for receiving and evaluating a deformation signal transmitted by the deformation measuring unit and for actuating the drive device.

A deformation sensor has several advantages compared to commonly used switching elements. The deformation sensor detects the deformation of a component and transmits it as a deformation signal, wherein the course of the deformation changes can be read. This means, that not a digital/binary signal is transmitted, as this is the case in a switching element, but makes an analog course of deformation or a deformation change available as deformation signal. The term "analog" does not mean, that the deformation signal cannot be scanned digitally and can be transmitted as a digital signal. It is, rather, meant, that not only two conditions of a measuring value, as this is the case in a switching signal (on/off), can be determined, but an analog signal or a digitally determined signal of a course of measuring values with an accuracy depending on the digital resolution.

This has the advantage, that assembly tolerances of the two element towards each other and the deformation measuring unit have no influence, when the drive device is actuated. Commonly used switching elements have a precise switching point, when reaching it or exceeding it, the switch is switched from one condition to another condition. Thus, it is clearly set, in which position of the switching element the drive device is actuated. The position of this switching point depends on the assembly tolerances. Especially then, when the drive device is actuated by a force exerted on an element of the container, i.e. the switching element is switched indirectly, e.g. via a flap of the container, the switching point is pre-set by the assembly tolerances. This is not the case, when using a deformation sensor. In this case, only an initial initialization has to take place, so that the control unit is taught such, that it knows at given assembly conditions the deformation signal, existing in the closed position, as a reference point and starting from this reference value can process relative deformation changes.

Preferably, the container is a piece of furniture or a household appliance, especially a fully integrated kitchen appliance. The first element can be a furniture shell and the second element can be an element held movable relative to the shell, especially a lid, a flap, a drawer or a door.

The deformation sensor is preferably a sensor for recording a relative deformation change, especially a piezo element with a piezo crystal or a strain gauge. Piezo elements and strain gauges have the advantage, that they enable deformation signals, which can already be evaluated during deformations, which are not noticed by a user.

The second element can be supported via the deformation measuring unit on the first element. The deformation measuring unit can, for example, be arranged on a first element in form of a shell of a piece of furniture, wherein the second element, for example in shape of a flap or a lid, is supported on the deformation measuring unit. The deformation measuring unit can be incorporated in a side wall of the shell such, that the deformation sensor projects slightly over the front edge of the side wall, so that the flap can come into abutment with the deformation sensor. In this case, the flap completely covers in the closed position the deformation measuring unit, so that it is not visible to the user. By of a force exerted from the outside onto the flap in direction towards the shell of the piece of furniture and, thus, towards the deformation sensor, the deformation signal thus produced is changed, whereby an actuation of the drive device can be triggered. Especially, when the deformation sensor is a piezo element with a piezo crystal, the necessary path or the necessary deformation is so small, that it is not noticed by a user, which leads to a pleasant haptical feeling during the actuation of the flap or of the drive device. Furthermore, such a deformation measuring unit can also be used in containers, in which sealing elements are provided between the shell of the piece of furniture and the flap or the first element and the second element, which only have to be deformed by a very small amount, to actuate the drive device.

The deformation measuring unit can have an accommodation element accommodating the deformation sensor, wherein the accommodation element is mounted in or on the first element. In this case, the second element is supported on the deformation sensor.

Furthermore, in the accommodation element an additional switch for actuating the drive device can be integrated. This can, especially, be of advantage, when the container is a wall unit with a flap moving upwards. By means of a pressure application onto the flap arranged in the closed position, the drive device can, as described above, be actuated, as the flap is supported via the deformation measuring unit on the shell. As soon as the flap is in the open position, a further device has to be provided, to move the flap again back into the closed position. This is achieved by a switch, which is preferably arranged in the accommodation element of the deformation measuring unit. Thus, no separate switching unit has to be provided. The present deformation measuring unit can be used, which then represents a single component with the deformation sensor and switches.

The deformation measuring unit can also be arranged on a component, especially a front of one of the elements. The deformation measuring unit does not have to be arranged between the two elements. The deformation can for example be detected by means of a strain gauge on a front of the second element. It is also possible, that the deformation measuring unit is arranged on the first element, for example on or in a shell, wherein even during a force loading on the second element, the deformation can be determined in the first element, insofar as the second element is supported on the first element. Thus, the deformation measuring unit can be arranged such, that it is not visible to a user.

Preferably, one of the elements, for example the second element, includes a first component and a second component, wherein the deformation measuring unit is arranged between the two components. Thus, a deformation or displacement of the two components relative to each other can be determined.

In this case, the first component of the second element can be represented in form of a front and the second component in the form of a support element, wherein the support element is, for example, a frame, which is displaceable within the first element and supports the front.

In a preferred embodiment the deformation sensor is formed like a plate and is arranged such, that it is bent during a force loading on the first component. Alternative, also a deformation sensor can be provided, which is stressed by compression.

In the preferred embodiment, the deformation measuring unit has an accommodation element accommodating the deformation sensor. The accommodation element is supported on the first component and on the second component.

In this case, the accommodation element can be formed with a pressure portion supporting the first component. The accommodation element has then preferably two support portions supporting the accommodation element on the second component. The deformation sensor is supported on a first side on the pressure portion and on a second side, facing away from the first side, on the support portions. Thus, during a displacement of the pressure portion relative to the two support portions, a deformation of the deformation sensor takes place.

As the deformation sensor records relative deformation changes, it can be provided, that the deformation sensor is held prestressed between the pressure portion and the support portions. Thus, always a deformation signal is provided, even when no deformation of the two components to each other or of one of the components has taken place. Thus, an existing play, which would lead to a measuring inaccuracy, is removed.

The pressure portion can have an attachment portion, wherein attachment projections of the second component are clamped between the attachment portion and the support portions. A deformation of the accommodation element is achieved during a force loading in the area between the two support portions, which can be detected by the deformation sensor.

Furthermore, the object is met by a method for actuating a drive device of a container according to the above type, wherein the course of the relative deformation change is evaluated by using of the deformation signal and by actuating the drive device when specific conditions are met. In this case, the deformation signal is evaluated such, that an unintended actuation of the drive device is prevented. Depending on the force loading, a specific course of the deformation signal is achieved, wherein by means of the course of the deformation signal it can be differentiated between different force loadings. The force loading onto the deformation measuring unit for example during a switching movement of a person can clearly be distinguished, from the course of the deformation signal during an unintended hitting or leaning against the second element.

BRIEF DESCRIPTION OF THE DRAWINGS

Preferred embodiments are described in detail in the following using the figures and herein it shows.

DETAILED DESCRIPTION OF THE INVENTION

Figure 1:
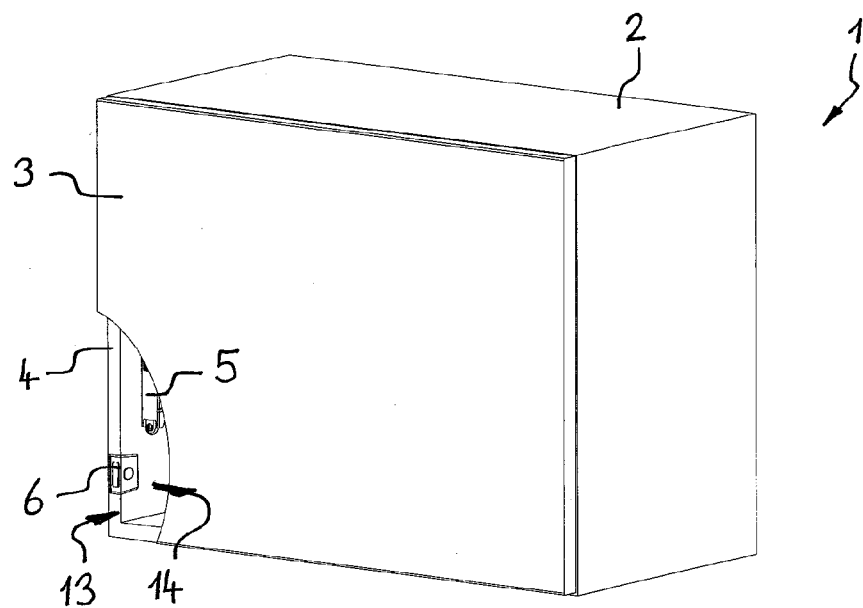
FIG. 1 a perspective representation of a cabinet having a shell and a lid in its closed position.
Figure 2:
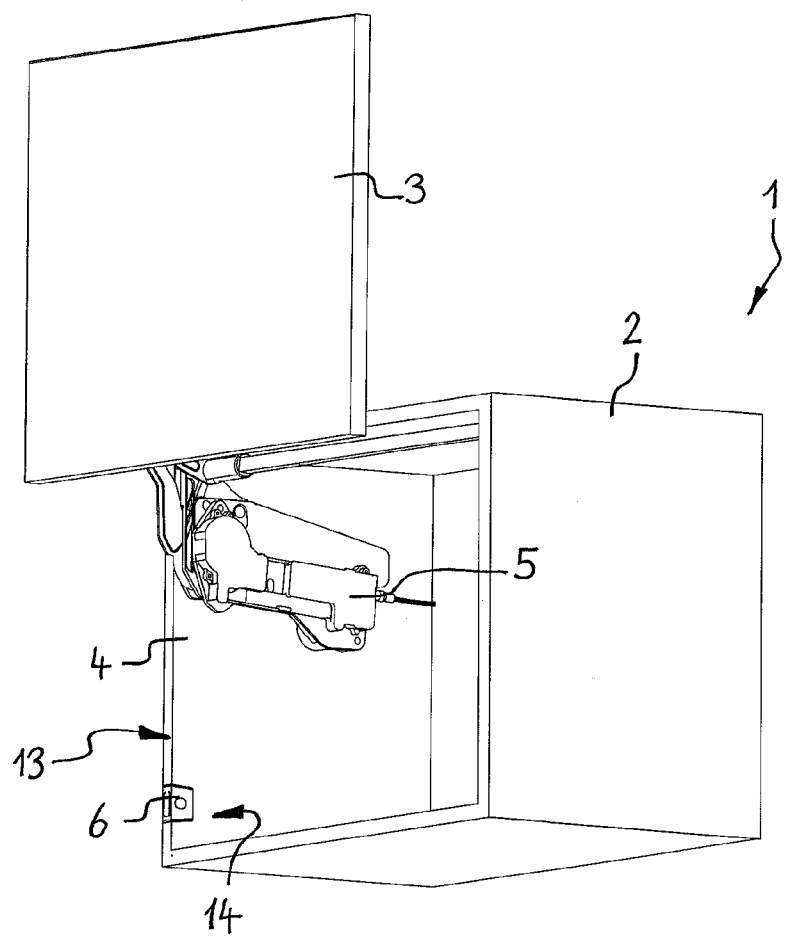
FIG. 2 a cabinet of FIG. 1 having a lid in its open position.

FIGS. 1 and 2 show a first embodiment of a container according to the invention, wherein the container is formed as a cabinet 1 and comprises a first element in form of a shell 2 and a second element in form of a lid 3. The lid 3 is connected via a drive device 5 in form of a lid opener to the shell 2 and can be moved relative to the shell 2 from the closed position shown in FIG. 1 to the open position shown in FIG. 2. The drive device 5 includes, in this case, an electric drive (e.g. an electric motor), which enables an automatic displacement of the lid 3.

Figure 3:
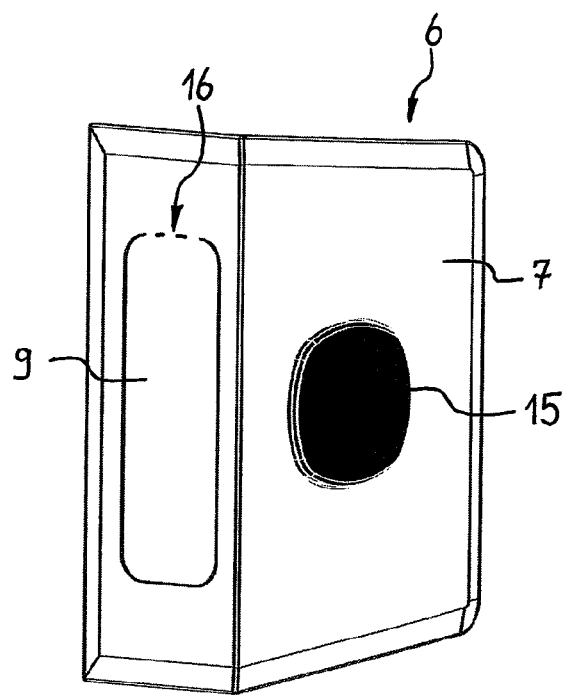
FIG. 3 a perspective representation of a deformation measuring unit of FIGS. 1 and 2.
Figure 4:
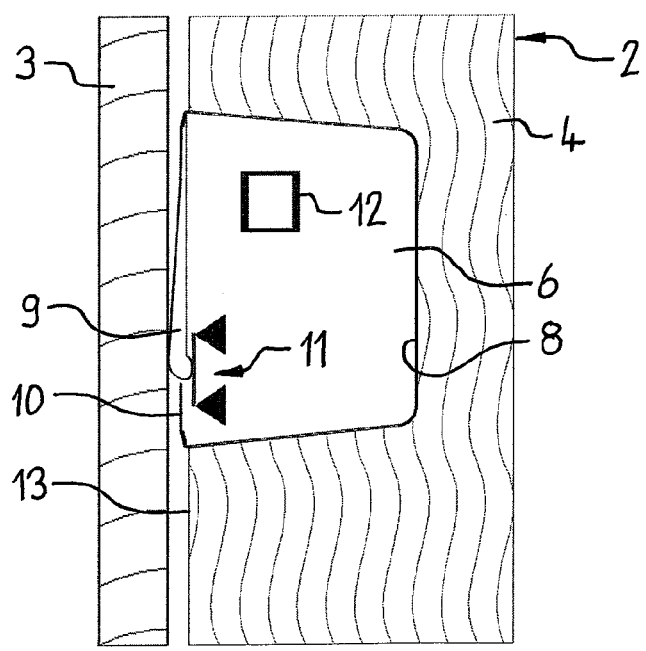
FIG. 4 an internal view of the cabinet having the deformation measuring unit of FIG. 3.

The shell 2 has a side wall 4, into which a deformation measuring unit 6 is incorporated. The deformation measuring unit 6 is shown in detail in FIGS. 3 and 4. FIG. 4 shows a partial cross-sectional view through the cabinet 1 of FIG. 1 with the lid 3 in its closed position. Furthermore, the deformation measuring unit 6 is shown schematically in a longitudinal sectional view.

The deformation measuring unit 6 includes an accommodation element in form of a housing 7. The housing 7 is received in a recess 8 of the side wall 4. The recess 8 starts from an end face 10 as well as from an inner face 14 of the side wall 4. The end face 10 is facing the lid 3, wherein the lid 3 covers the end face 10 in the closed position. The deformation measuring unit 6 comprises a sensing arm 9, which is, in the present example, formed integrally with the housing 7 and is arranged deformably relative thereto. Preferably, the housing 7 is manufactured from plastic, so that the sensing arm 9 is connected via a film hinge 16 to the housing 7 and is elastically movable. In this case, the sensing arm 9 projects over a front face 13 of the housing 7 and over the end face 10 of the side wall 4. The lid 3 is, as can be seen in FIG. 4, supported in its closed position via the sensing arm 9 on the deformation measuring unit 6 and, thus, indirectly on the shell 2.

In the inner of the housing 7, a piezo element 11 is arranged, which is schematically shown in FIG. 4. By means of a force loading on the sensing arm 9 in direction of the piezo element 11, a force is thus acting on the piezo element 11, which comprises a piezo crystal, so that a deformation signal is produced by the piezo element 11. The deformation signal is transmitted to a control unit 12, which is an integral component of the deformation measuring unit 6 or is provided as a separate unit, which is connected via a common data connection, for example a radio link or a cable connection, to the deformation measuring unit 6. The control unit 12 is, furthermore, connected via common data connections to the drive device 5, so that during a force loading on the lid 3 via the sensing arm 9 onto the piezo element 11, an actuation of the drive device 5 is possible.

On the side of the deformation measuring unit 6, which projects from the side wall 14 out of the recess 8, a separate switch 15 is provided. The switch 15 can be actuated manually, so that when the lid 3 is open, the lid 3 can be transferred by means of the easy reachable switch 15 from its open position again into its closed position. For this the switch 15 is also connected to the control unit 12 via a data connection.

Figure 5:
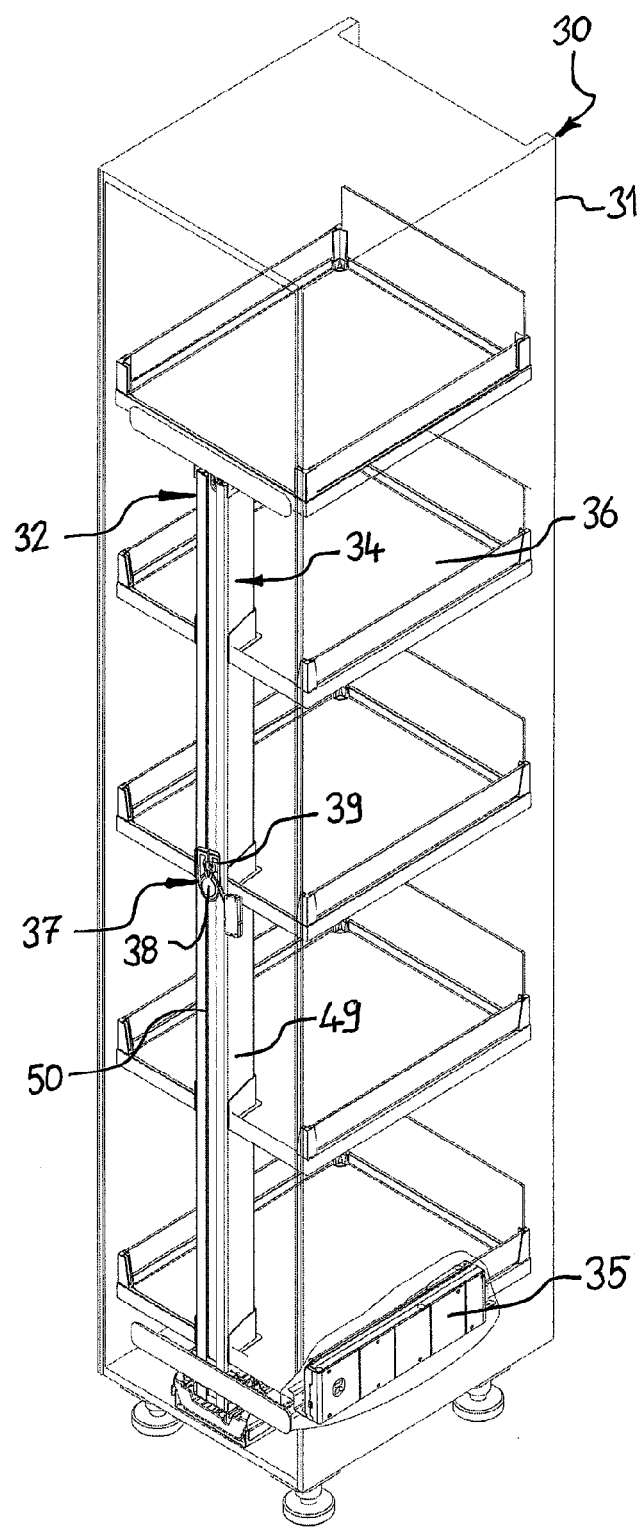
FIG. 5 a second embodiment of a cabinet with a shell and a pullout/drawer.

In FIGS. 5 to 8, a second embodiment of a container according to the invention is shown in the form of a cabinet 30, having a first element in form of a shell 31 and a second element in the form of a pullout/drawer 32. In FIG. 5 the shell 31 is shown schematically by indication of the outer edges. The pullout 32 includes a front 33 (FIG. 8) and a support element 34. The support element 34 is arranged linearly displaceable within the shell 31 and is driven electrically by a drive device 35, so that by actuating the drive device 35 the pullout 32 can be driven out and again back into the shell 31. A solution may also be considered, in which the pullout is only expelled a bit from the shell 31 and the further movement is achieved by free-wheeling or manually. Several shelves 36 are arranged on the support element 34 for storing objects. Between the front 33 and the support element 34, a deformation measuring unit 37 is provided, which actuates the drive device 35.

Figure 6:
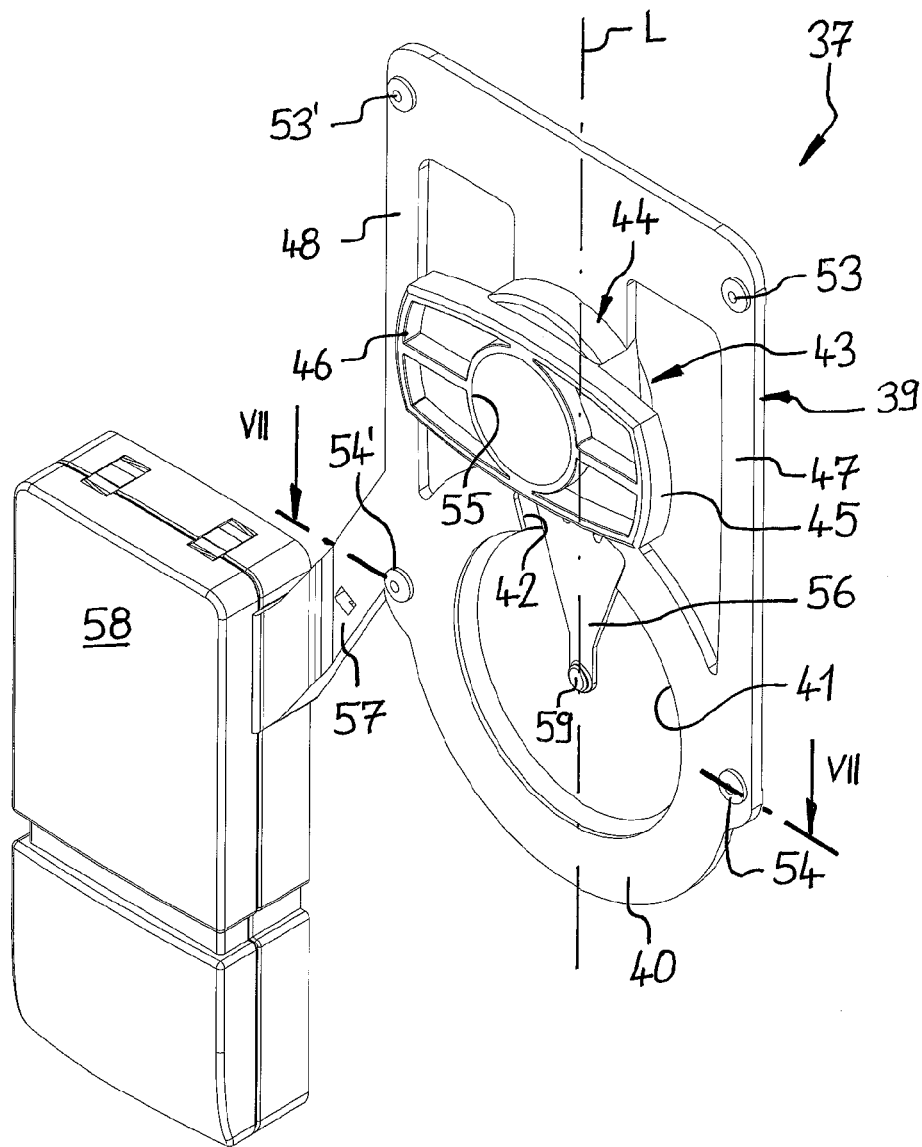
FIG. 6 a perspective view of a deformation measuring unit for the application in a cabinet of FIG. 5.
Figure 7:
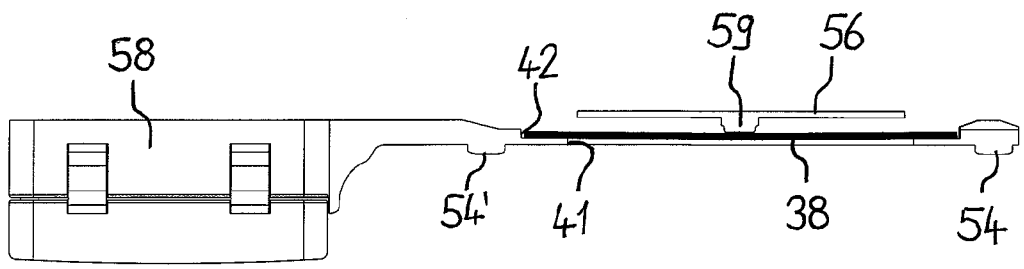
FIG. 7 a cross-sectional view along the intersection line VII-VII of FIG. 6.
Figure 8:
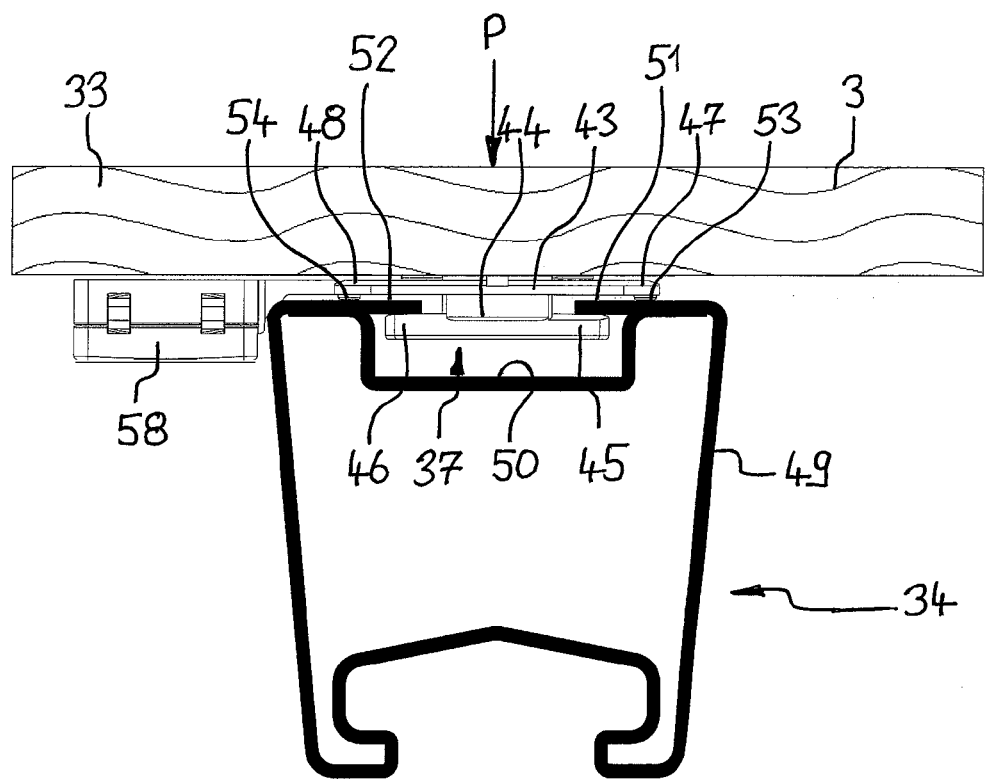
FIG. 8 a cross-sectional view through a part of the pullout/drawer of the cabinet of FIG. 5.

The deformation measuring unit 37 is shown in detail in FIGS. 6 to 8. The deformation measuring unit 37 comprises a deformation sensor 38, formed plate-like. The deformation sensor 38 is not shown in FIG. 6 for clarity. The deformation measuring unit 37 includes further an accommodation element 39, formed frame-like. The deformation sensor 38 is mounted on the accommodation element 39. The accommodation element 39 has a fixing portion 40 with a circular through opening 41. Towards one side, the through opening 41 has an annular fixing recess 42, into which the deformation sensor 38 can be inserted. A pressure arm 56 with a central pressure projection 59 projects radially from the edge of the through opening 41 up to the center of the through opening 41. The deformation sensor 38 is arranged between the pressure arm 56 and the fixing recess 42 or is held by the pressure arm 56. The pressure arm is supported with a pressure projection 59 on the deformation sensor 38, in the fixing recess 42. Thus, the deformation sensor 38 is fixed on the accommodation element 39.

The accommodation element 39 has further a pressure portion 43, which is arranged centrally to a longitudinal axis L of the accommodation element 39. The pressure portion 43 has an attachment portion 44, which comprises two tabs 45, 46, projecting respectively from one side of the longitudinal axis L.

Two support portions 47, 48 of the accommodation element 39 are provided on both sides of the longitudinal axis L.

For attaching the accommodation element 39, the support element 34 has a vertically extending pillar 49 with an also vertically extending attachment groove 50. The attachment groove 50 is facing the front 33. The attachment groove 50 is flanked along its longitudinal extension direction at both sides by plate-like attachment projections 51, 52, which form together with the attachment groove 50 respectively an undercut. The accommodation element 39 is inserted with the attachment portion 44 into the attachment groove 50 such, that the tabs 45, 46 engage behind the attachment projections 51, 52, wherein the tabs 45, 46 are supported on the latter on the side of the attachment projections 51, 52 facing the attachment groove 50. The support portions 47, 48 are supported on the side of the attachment projections 51, 52 facing away from the tabs 45, 46 on the pillar 49. The accommodation element 39 is, in this case, preferably dimensioned such, that the attachment projections 51, 52 are clamped with bias between the tabs 45, 46 and the support portions 47, 48.

In this case, the accommodation element 39 is arranged between the pillar 49 of the support element 34 and the front 33, so that a loading force is introduced in the force introduction direction P. The accommodation element 39 is deformed via the pressure portion 43. The accommodation element 39 is supported on the front 33, wherein this deformation is transferred to the deformation sensor 38. During a deformation in force introduction direction P, the attachment portion 44 is pushed deeper into the attachment groove 50, wherein the tabs 45, 46 lift off the attachment projections 51, 52. To facilitate this deformation, the support portions 47, 48 have support projections 53, 53', 54, 54', which project in direction towards the pillar 59 from the support portions 47, 48 and by means of which the support portions 47, 48 are supported on the pillar 49. The support projections 53, 53', 54, 54' are formed burled and form thus points of rotation, around which the accommodation element 49 can pivot during deformation.

The attachment portion 44 comprises further a bore 55, which is aligned with the attachment groove 50 and extends starting therefrom in direction to the front 33. The attachment portion 44 can be rigidly screwed to the front 33 via the bore 55 or can be connected in any other way. Thus, also a force in opposition to the force introduction direction P can be achieved, wherein in this direction, the tabs 45, 46 are supported on the attachment projections 51, 52 and no deformation of the accommodation element 39 is produced. Thus, the deformation measuring unit 47 can also be used for pullouts 32, which have a drawbar on the side of the front 33 facing away from the pillar 49. The deformation measuring unit 47 behaves elastically, thus, when a force is produced in an opposite direction to the force introduction direction P and is rigid against the force introduction direction P.

The pressure arm 56 on the pressure portion 43 serves also for the better transmission of the deformations of the accommodation element 39 onto the plate-like deformation sensor 38. The pressure arm 56 projects radially into the through opening 41 and is supported centrally on the deformation sensor 38. Thus, a pressure force, which acts in the force introduction direction P onto the front, is transmitted centrally onto the deformation sensor 38 and ensures a sufficient deformation of the deformation sensor 38 also at low pressures.

The accommodation element 39 has a web 57, on which end a control unit 58 is mounted. The control unit 58 receives via a common data connection the deformation signal of the deformation sensor 38 and processes this. Furthermore, the control unit 58 is connected to the drive device 35 via a data connection, like for example a cable connection or a radio link, to be able to actuate the drive device 35.

REFERENCE NUMERALS LIST 1 cabinet
2 shell
3 lid
4 side wall
5 drive device
6 deformation measuring unit
7 housing
8 recess
9 sensing arm
10 front face
11 piezo element
12 control unit
13 end face
14 inner face
15 switch
16 film hinge
30 cabinet
31 shell
32 pullout/drawer
33 front
34 support element
35 drive device
36 shelf
37 deformation measuring unit
38 deformation sensor
39 accommodation element
40 fixing portion
41 through opening
42 fixing recess
43 pressure portion
44 attachment portion
45 tab
46 tab
47 support portion
48 support portion
49 pillar
50 attachment groove
51 attachment projection
52 attachment projection
53 support projection
54 support projection
55 bore
56 pressure arm
57 web
58 control unit
59 pressure projection
L longitudinal axis
P direction of the force introduction

The invention claimed is:

1. A container comprising;
a first element and at least one second element movable relative to the first element between a closed position and an open position;
a drive device for moving the second element;
at least one deformation measuring unit with a deformation sensor is provided on at least one of the elements for detecting a force exerted on one of the elements, the deformation measuring unit having an accommodation element mounted to the first element for accommodating the deformation sensor, wherein the second element is supported on the deformation sensor;
a switch for actuating the drive device integrated into the accommodation unit; and
a control unit for receiving and evaluating a deformation signal transmitted by the deformation measuring unit and for actuating the drive device.

2. The container according to claim 1, wherein
the container is a cabinet or a household appliance,
the first element is a shell and
the second element is a closing element movably held relative to the shell.

3. The container according to claim 1, wherein
the deformation sensor is a sensor for recording a relative deformation change and has a piezo element or a strain gauge.

4. The container according to claim 1, wherein
the second element is supported by the deformation measuring unit on the first element.

5. The container according to claim 1, wherein
the deformation measuring unit is arranged on the front of one of the first element or second element.

6. The container according to claim 1, wherein
one of the first or second elements comprises a first component and a second component and
the deformation measuring unit is arranged between the first and second components.

7. The container according to claim 6, wherein
the first component is a front and the second component is a support element.

8. The container according to claim 6,
wherein
the deformation sensor is plate-like and is arranged such, that the deformation sensor is bent during a force exerted on the first component.

9. The container according to claim 6,
wherein
the deformation measuring unit has an accommodation element accommodating the deformation sensor, and
the accommodation element is supported on the first component and on the second component.

10. The container according to claim 9,
wherein
the accommodation element is supported with a pressure portion on the first component and with two support portions on the second component, and
the deformation sensor is supported, on a first side, having the pressure portion and, on a second side facing away from the first side, having support portions.

11. The container according to claim 10,
wherein
the deformation sensor is held prestressed between the pressure portion and the support portions.

12. The container according to claim 10,
wherein
the pressure portion has an attachment portion, and wherein attachment projections of the second component are clamped between the attachment portion and the support portions.

* * * * *

UNITED STATES PATENT AND TRADEMARK OFFICE
CERTIFICATE OF CORRECTION

PATENT NO. : 9,790,730 B2  
APPLICATION NO. : 14/890326  
DATED : October 17, 2017  
INVENTOR(S) : Rene Barkau Page 1 of 1

It is certified that error appears in the above-identified patent and that said Letters Patent is hereby corrected as shown below:

On the Title Page

Item (73), Assignee, delete "Kessebohmer Holding e.K." and insert -- Kessebohmer Holding KG --, therefor.

Signed and Sealed this  
First Day of January, 2019

Andrei Iancu  
*Director of the United States Patent and Trademark Office*